(12) United States Patent
Closs et al.

(10) Patent No.: US 11,605,524 B2
(45) Date of Patent: Mar. 14, 2023

(54) SYSTEM FOR SAMPLE STORAGE AND SHIPPING FOR CRYOELECTRON MICROSCOPY

(71) Applicant: Mitegen, LLC, Ithaca, NY (US)

(72) Inventors: David Closs, Freeville, NY (US); Jessica Benitez, Ithaca, NY (US); Benjamin Apker, Ithaca, NY (US); Mazdak Radjainia, Eindhoven (NL)

(73) Assignee: MiTeGen, LLC, Ithaca, NY (US)

( * ) Notice: Subject to any disclaimer, the term of this patent is extended or adjusted under 35 U.S.C. 154(b) by 268 days.

(21) Appl. No.: 17/034,665

(22) Filed: Sep. 28, 2020

(65) Prior Publication Data

US 2021/0098226 A1    Apr. 1, 2021

Related U.S. Application Data

(60) Provisional application No. 62/906,873, filed on Sep. 27, 2019.

(51) Int. Cl.
*H01J 37/20*    (2006.01)
*G01N 1/42*    (2006.01)

(52) U.S. Cl.
CPC ............... *H01J 37/20* (2013.01); *G01N 1/42* (2013.01)

(58) Field of Classification Search
CPC .... H01J 37/20; H01J 37/185; H01J 2237/204; H01J 2237/2001; G01N 1/42; G01N 23/20033
See application file for complete search history.

(56) References Cited

U.S. PATENT DOCUMENTS

2018/0024032 A1*   1/2018   Hollabaugh ............ F16H 57/08
                                                        475/331

* cited by examiner

*Primary Examiner* — Emmanuel E Duke
(74) *Attorney, Agent, or Firm* — Quinn IP Law (57) ABSTRACT

A system for storing and shipping samples for cryo-electron microscopy. The system comprising a cassette puck and support platform that accepts commercial cryo-EM sample cassettes and is compatible to a substantial extent with tools used in cryocrystallography. The system can also work with existing Cryo-EM storage and transport puck and cane systems. The cassette puck comprising a receptacle for holding one or more cassettes and a plurality of holes and grooves. The holes and grooves being configured for use with other tools such as tongs, support platforms, and canes.

19 Claims, 8 Drawing Sheets

SYSTEM FOR SAMPLE STORAGE AND SHIPPING FOR CRYOELECTRON MICROSCOPY

REFERENCE TO RELATED APPLICATIONS

The present application relates and claims priority to U.S. Provisional Application No. 62/906,873, filed Sep. 27, 2019, the entirety of which is hereby incorporated by reference.

ACKNOWLEDGEMENT OF GOVERNMENT SUPPORT

None.

BACKGROUND

The invention pertains to the field of biotechnology. More particularly, the invention pertains to the design of systems handling, storing, and shipping samples to be examined using cryo-electron microscopy.

Single-particle cryoelectron microscopy (cryo-EM) is a powerful method for determining the structures of large biomolecules and biomolecular complexes. Recent technical advances have significantly improved the resolution that can be achieved to near and below 3 Angstroms in favorable cases, so that atomic positions can often be accurately determined. This has made cryo-EM competitive with X-ray crystallography. Cryo-EM is now often the first choice method for structure determination because, unlike crystallography, it does not require that the biomolecule be crystallized. Structures of many biomolecular complexes that could not be crystallized in previous efforts are now being determined using cryo-EM. Demand for the method has soared, and research institutions around the world are upgrading their cryo-EM facilities to meet this demand.

Cryo-EM instrument manufacturers have been upgrading their sample handling hardware to facilitate loading and measurement of much larger numbers of samples. For example, at least two of Thermo Fisher Scientific's newer cryo-EM products use an autoloading system, where a capsule is loaded with a cassette in a special cassette/capsule loading station. Each cassette holds up to 12 grids, which must be "clipped" with supporting rings to increase rigidity and facilitate automated handling. The capsule with the cassette is then loaded into the autoloading cryo-electron microscope and the cassette is automatically transported into the machine. When cryo-EM measurements on the samples in the cassette have been concluded, the cassette the cassette is transported back into the capsule, and the capsule is removed.

Compared with cryo-crystallography, the tools and infrastructure for handling, storing, and shipping cryo-EM samples are primitive and difficult to use. Beginning in the early 2000s, a large infrastructure for high-throughput handling of samples for X-ray crystallography at synchrotron X-ray sources was developed. Most labs engaged in structural biology research—including most researchers who use cryo-EM—own a collection of tools for handling of samples for X-ray crystallography that are compatible with synchrotron sample handling and tracking hardware and software. Consequently, rather than creating a completely new set of tools and hardware for high-throughput handling of cryo-EM samples, there is strong impetus to build upon the existing infrastructure for handling crystallography samples.

SUMMARY OF THE INVENTION

The present inventions relate to the design, function and use of systems for storing and shipping samples for cryo-electron microscopy.

This application describes a sample storage system for use in cryo-EM. The objectives in designing and implementing this system were that it accept commercial cryo-EM sample cassettes and be compatible to a substantial extent with tools used in cryocrystallography.

The system for sample storage and shipping for cryoelectron microscopy embodies a 'cassette puck' that would hold one or more cassettes, the cassette puck working with the existing Cryo-EM storage and transport puck and cane system.

The cassette puck for holding cryoelectron microscopy samples that is compatible with sample handling and storage tools for X-ray cryocrystallography, comprises: a body comprising a first surface, second surface, first side, and second side; a receptacle formed in the first surface dimensioned to accept a sample cassette and a handling tool; a first and second hole formed through the first and second surface in the body that allow the puck to be gripped with tongs from above, wherein the first hole is positioned above the receptacle of the first surface and the second hole is positioned below the receptacle on the first surface; and a set of grooves formed on the first and second sides dimensioned to allow the cassette puck to be gripped with a set of tongs from the side.

According to an embodiment, the cassette puck further comprises at least one grid box receptacle having an integral protrusion and a pin dimensioned to insert into a notch in a grid box and keep it in a fixed orientation corresponding to its indexing.

According to an embodiment, the cassette puck further comprises a through-hole formed through the first and second surfaces into which a locking rod can be inserted.

According to an embodiment, the cassette puck further comprises a semicircular engagement groove formed through the first and second surfaces in an upper portion of the body used to align the cassette puck in storage and transport canes.

According to an embodiment, the cassette puck further comprises a magnet on the second surface.

According to an embodiment, the cassette puck further comprises a cover that rotates about a shaft on the first surface to cover the receptacle and hold the sample cassette in place.

According to an embodiment, the cassette puck further comprises a cover lock comprised of a set screw and a hole in the cover.

The sample holder system for cryoelectron microscopy samples that is compatible with sample handling and storage tools for X-ray cryocrystallography, comprises: a cassette puck comprising a first surface, second surface, first side, and second side; a receptacle formed in the first surface dimensioned to accept a sample cassette and a handling tool; a first and second hole formed through the first and second surfaces that allow the cassette puck to be gripped with tongs from above, wherein the first hole is positioned above the receptacle of the first surface and the second hole is positioned below the receptacle on the first surface; a set of grooves formed on the first and second sides dimensioned to allow the cassette puck to be gripped with a set of tongs from the side; and a cassette puck support platform, wherein the cassette platform comprising a recess configured to hold the cassette puck in a fixed orientation during loading of the sample cassette.

According to an embodiment, the cassette puck support platform further comprises a post that can be inserted into the through-hole of the cassette puck, to fix the cassette puck's orientation in the support platform and prevent it from sliding.

According to an embodiment, the cassette puck support platform further is sized and shaped to fit within a commercial Thermo Fisher liquid nitrogen-filled loading station.

The process comprises filling a cassette loading station with liquid nitrogen; placing a cassette puck support platform into the cassette loading station so that it is fully immersed in liquid nitrogen; unlocking and rotating open the cover of a cassette puck; placing the cassette puck onto the cassette puck support platform so that it is held in place by features of the cassette puck support platform and cannot rotate or slide, and so that it is fully immersed in liquid nitrogen; loading grid boxes which may contain grids holding samples into the grid box receptacles of the cassette puck, so that they are fully immersed in liquid nitrogen; grabbing a cryo-EM sample cassette using a handling tool, inserting it into the cassette puck, so the cassette gripping end is still immersed in liquid nitrogen; opening the lids of the grid boxes to access the grids within; screwing the lids of the grid boxes into the puck to secure the grid boxes within the cassette puck; transferring selected grids from the grid box to the sample cassette; and closing the cassette puck cover by rotating it 180 degrees and engaging the cover lock with the cover to prevent subsequent rotation; unscrewing the lids of the grid boxes from the cassette puck, screwing them into the grid boxes, closing the lids, and removing the grid boxes.

According to an embodiment the process can also comprise the steps of grabbing the cassette puck using puck handling tongs, removing the cassette puck from the cassette puck support platform and cassette loading station placing the cassette puck on an insulated surface or into a Dewar with liquid nitrogen, and changing the tong grip on the cassette puck to allow insertion into a storage or transport cane; or alternatively using a second set of tongs to grip the cassette puck at its end as needed to allow insertion into a storage cane; and transferring the cassette puck to either a puck storage cane or puck transport cane.

BRIEF DESCRIPTION OF THE DRAWINGS

FIG. 2 (A) is a perspective view of a cassette puck in accordance with an embodiment.

FIG. 2 (B) is a perspective view of a sample cassette, cassette puck, and support platform in accordance with an embodiment.

FIG. 3 (A) is a front view of a cassette puck in accordance with an embodiment.

FIG. 3 (B) is a back view of a cassette puck in accordance with an embodiment.

FIG. 5 (A) is a perspective view of a cassette puck and Thermo Fisher cryo-EM sample cassette in a Thermo Fisher loading station in accordance with an embodiment.

FIG. 5 (B) is a perspective view of a cassette puck being gripped with puck handling tongs during placement onto the support platform in the loading station in accordance with an embodiment.

DETAILED DESCRIPTION OF THE INVENTION

Figure 1:
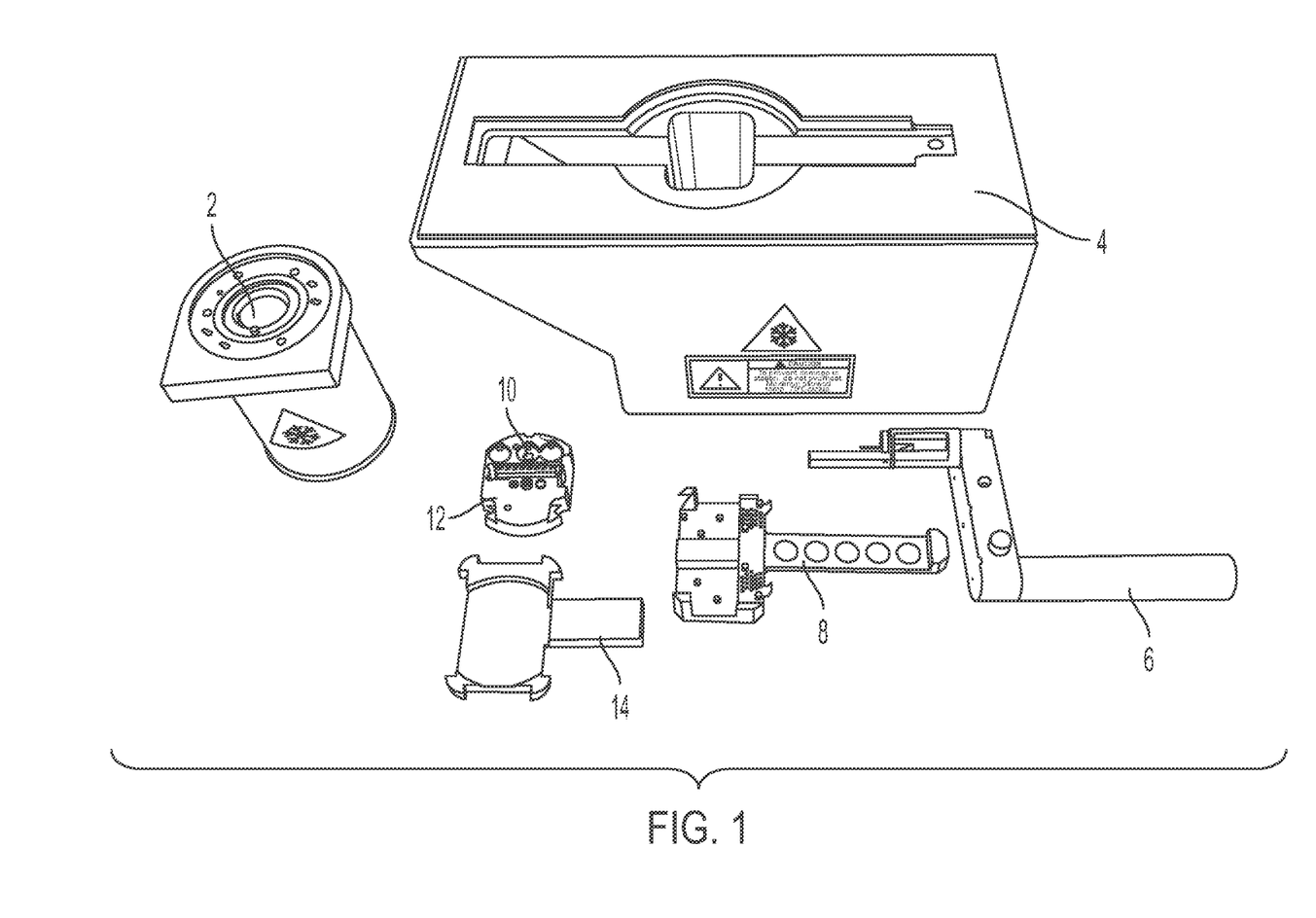
FIG. 1 is a perspective view of a Thermo Fisher capsule, Thermo Fisher loading station, Thermo Fisher large handling tool, Thermo Fisher support platform, Thermo Fisher cryo-EM sample cassette, cassette puck, and support platform in accordance with an embodiment.

The system for sample storage and shipping for cryoelectron microscopy generally comprises a cassette puck 12 and a first support platform 14. In FIG. 1, there is shown a perspective view of an embodiment of the cassette puck 12 and the first support platform 14. Also shown are some of the Thermo Fisher products that the system works with, including a capsule 2, a cassette/capsule loading station 4, a large handling tool 6, a second support platform 8, and a cryo-EM sample cassette 10. The system can also work with Thermo Fisher cassette small tongs; a cryo-EM storage cane 32; a cryo-EM shipping cane 36; and puck handling tongs 30.

Figure 2A:
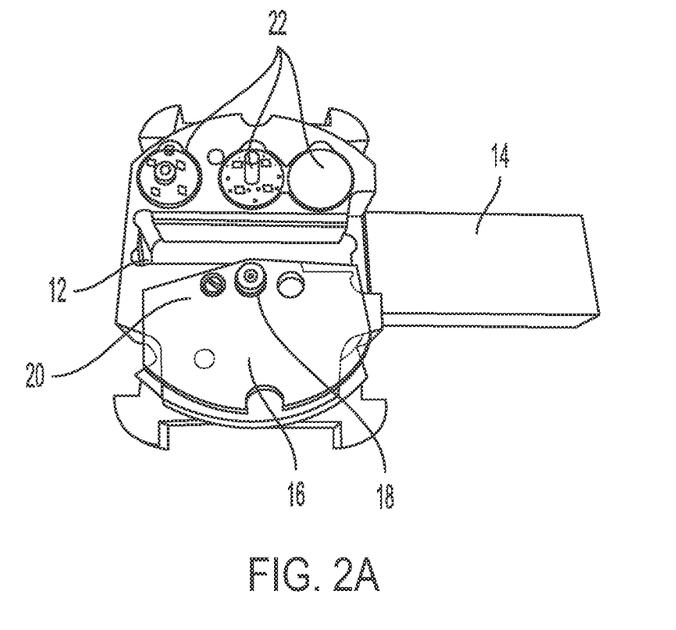
Figure 2B:
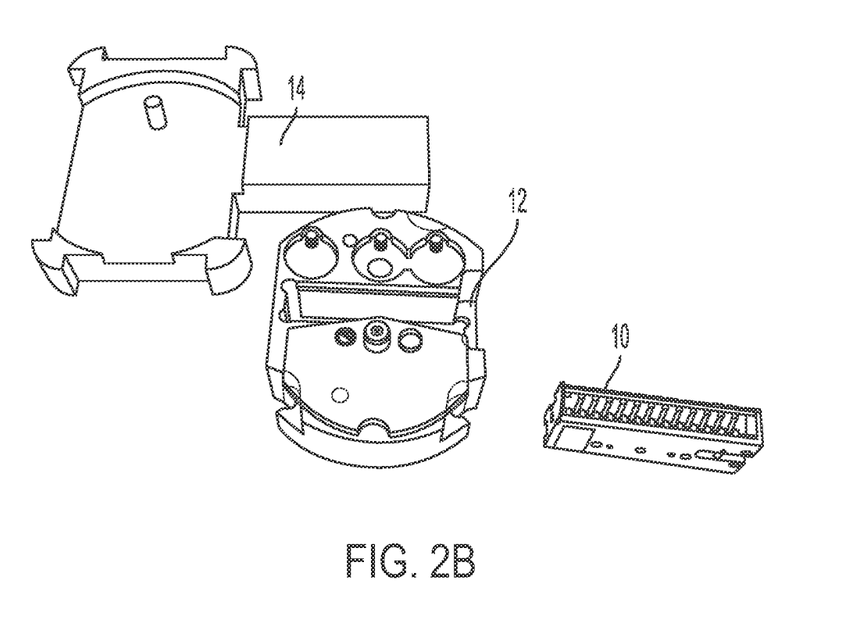

As seen in FIG. 2(A) cassette puck 12 generally comprises integral cover 16, rotation shaft 18, set screw 20, and commercial grid boxes 22. Cassette puck 12 can accept and hold cryo-EM grid sample cassette 10. The cassette puck 12 has at least one, indexed grid box 22 sufficient to hold twelve grids, which is the capacity of a cassette. In the embodiment shown cassette puck 12 has three grid boxes 22. Integral cover 16 is turned by and rotates about rotation shaft 18 and is locked in place using set screw 20. FIG. 2 (B) shows a Thermo Fisher cryo-EM sample cassette 10, cassette puck 12, and support platform 14.

Integral cover 16 covers the cassette holding area and is a clear plastic cryogenic-compatible cover 16 to secure the cassette 10. Puck cover 16 locks with set screw 20 raised into a hole in the cover in the same fashion as a Cryo-EM puck. The cassette 10 is stored by placing it into a rectangular receptacle 46 in cassette puck 12 slightly larger than the cassette, and when the cover 16 is closed the cassette 10 is prevented from moving upwards out of the recess, locking the cassette into cassette puck 12.

Figure 3A:
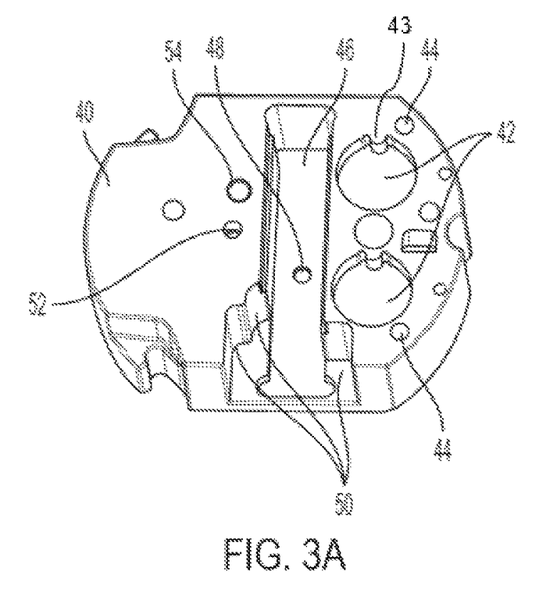

FIG. 3 (A) there is shown an implementation of the base portion 40 of the cassette puck 12, before assembly with the cover 16 and other components, according to the present invention. Cassette puck 12 has recesses 42 shaped to hold grid boxes 22 in a fixed orientation, so that the indexed grid holding receptacles in each grid box are always in the same position/orientation relative to cassette puck 12. Otherwise, grid boxes 22 may rotate when the puck cover 16 is manipulated, or when the grid box lid is manipulated to expose the grids within. Depending upon the design of the grid box, this may involve tightening and loosening a central screw, removing a lid held by a pin, or rotating a lid that has an opening for retrieving a single grid. The indexing mechanism, which holds the grid boxes in the correct orientation, may be provided by an integral protrusion 43 or via a pin or length of screw as in FIG. 3(*a*). This indexing feature can be included in any cassette puck 12, not just one for use with the present hardware and invention. Cassette puck 12 can also include threaded holes 62 to screw in pin-type lids to secure the grid boxes in cassette puck 12.

Figure 3B:
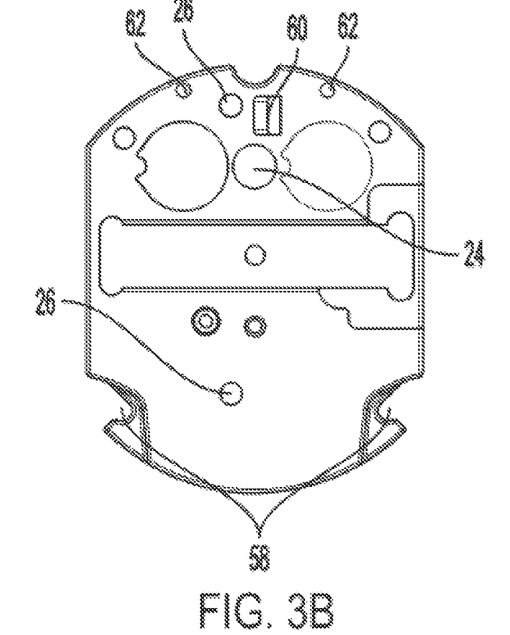

Receptacle 46 for the Thermo Fisher cryo-EM cassette has a hole 48 that allows liquid nitrogen to drain out of the receptacle when cassette puck 12 is removed from liquid nitrogen. Cassette puck base has a structure 50 on one side of the cassette receptacle that mates to a Thermo Fisher Large Handling tool and holds it in position when a cassette is being transferred to or from puck 12. Threaded holes 52 and 54 are for the rotation shaft and locking set screw of the cover, respectively. Through-holes 26 allow puck 12 to be gripped using puck handling tongs during transfer to or from the Thermo Fisher capsule. The structure 58 allows puck 12 to be securely gripped with puck handling tongs during transfer to or from a puck storage cane or a puck transport cane. An inspection trough 60 allows individual grids to be examined before loading into a Thermo Fisher sample cassette or commercial grid box. Threaded holes 62 allow pin-type lids that hold the grid boxes in place to be screwed in. Hole 24 is for a locking rod used in puck storage and shipping canes.

When a cassette 10 is in puck 12, clipped grids may be inserted into or removed from the cassette 10. When inserting or removing grids, the grids would be taken from or inserted into the up to three grid boxes 22 that may be located on puck 12 or elsewhere in a liquid nitrogen filled Dewar, such as on a Dewar Insert. Grids can be placed in the inspection trough 60 and examined, e.g., for damage or for identifying markings, before transfer to or from the cassette. Before removing puck 12 from the Dewar (not shown) or loading station 4, the grid boxes 22 would be removed and the cover closed and locked.

In one embodiment the cassette puck 12 has the following dimensions: diameter of 67 mm; width between flat vertical faces of puck of 52.5 mm; height of puck of 19.38 mm; diameter of circular recess 28 of 6.85 mm; length, width, and depth of receptacle 46 for grid cassette of 49.1 mm, 9.95 mm (lower—set by cassette width) and 11.45 mm (upper—to provide clearance for the Thermo Fisher large handling tool 6, and 16.88 mm; position of center of cassette recess relative to center of puck of 3.5 mm towards notch 28; depth of structure 50 from top surface of puck base: 15.88 mm; diameter of holes 26 for puck handling tongs of 3.658 mm; diameter of magnet holes 44 of 3.264 mm; diameter of locking rod hole 24 of 6.858 mm; diameter of drain hole 48 of 3 mm; diameter of circular cutouts 58 for puck handling tongs of 3.3 mm; height of structure 58 for puck handling tongs of 11.38 mm; thread of threaded holes 52, 54, and 62 of 4-40, 10-24, and 4-40, respectively; and diameter and depth of grid box recesses 42 of 14.207 mm and 3.97 mm, respectively. The diameter of the curved portions of the cassette matches that of unipucks used in X-ray cryocrystallography.

The cassette puck 12 base may be made of aluminum or stainless steel, or any material that has good thermal conductivity and adequate thermal mass to ensure that pucks 12 and the cassettes within them do not warm appreciably during transfers between the capsule, storage canes, and transport canes.

Figure 4:
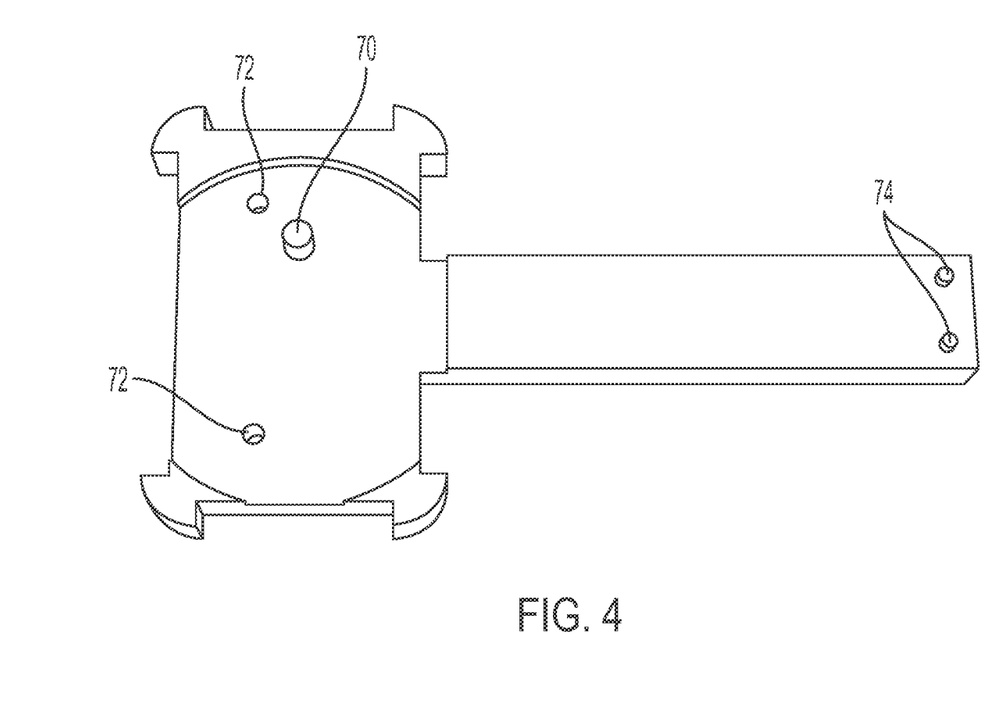
FIG. 4 is a perspective view of a support platform in accordance with an embodiment.

Cassette puck 12 is dimensioned to fit into support platform 14. In FIG. 4 there is an implementation of support platform 14 showing post 70 that inserts into the puck's hole 24, two holes 72 into which puck handling tongs 30 can be inserted, and two posts 74 that lock into holes in the bottom of the cassette handling tool 6 to keep the tool upright when not in use. In addition to a post 70 that inserts into the locking rod hole 24 of puck 12, the support platform has two holes 72 allow the support platform to be handled using puck handling tongs 30. The platform may also have two posts 74 that lock into holes in the bottom of the cassette handling tool 6 to keep the tool upright when not in use.

In one embodiment support platform 14 has the following dimensions: overall width of 80.85 mm; width between recessed flat faces of 66.3 mm; length of wide portion of support of 55.85 mm; distance between flat face at left end and step at the handle of 50.85 mm; diameter of holes 72 for tongs of 4.166 mm; and diameter and height of posts 74 of 2.6 mm and 3 mm, respectively.

Figure 5A:
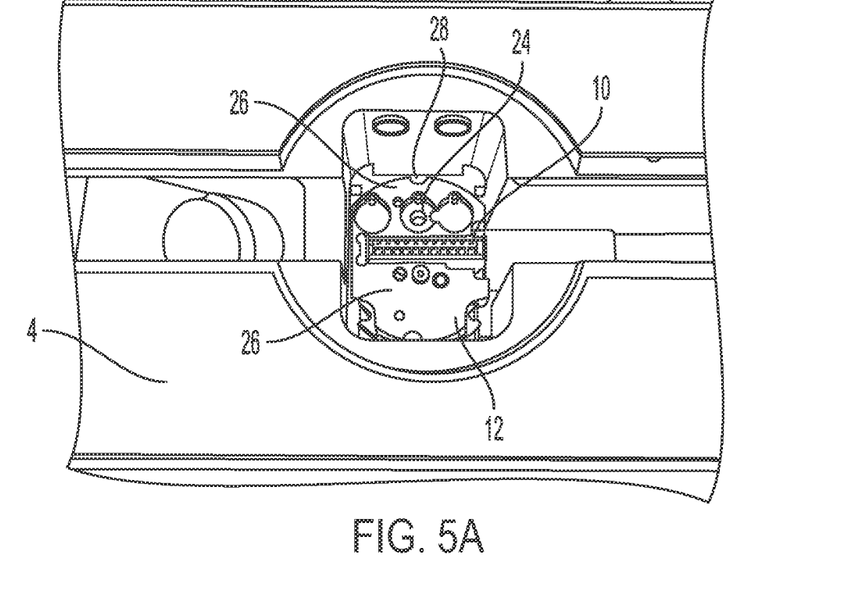

In FIG. 5 (A) there is shown cassette puck 12 with locking rod hole 24, holes 26, a semicircular engagement groove 28, and Thermo Fisher cryo-EM sample cassette 10 in a Thermo Fisher loading station 4. Holes 26 that allow puck 12 to be gripped using the puck handling tongs 30, for placement into and removal from the loading station 4.

The first support platform 14 fits into the loading station 4 and replaces the second (metal) platform 8 that comes with the loading station 4. The figures show a 3D-printed prototype and metal production version. To work with the cassette/capsule loading station 4, cassette 10, and cassette handling tool 6, the cassette puck 12 uses the first support platform 14 that resides in the loading station 4. The first support platform 14 orients the puck 12 in the loading station 4 and acts as a vertical aligning tool for engaging the cassette handling tool 6 with the cassette 10.

Figure 5B:
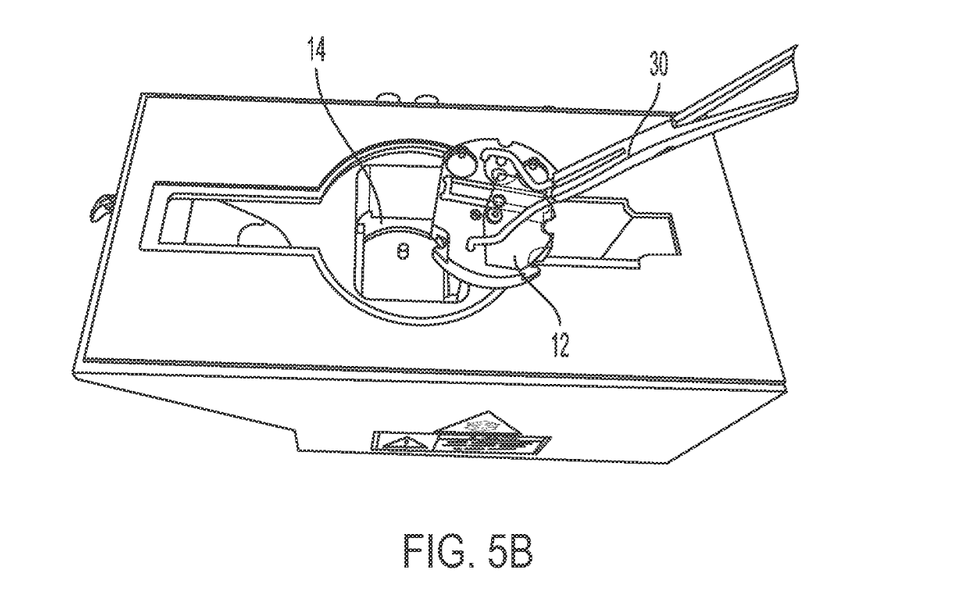

FIG. 5 (B) shows cassette puck 12 being gripped with puck handling tongs 30 during placement onto the support platform in loading station 4. The cassette puck 12 shares the same general outline and shelf retaining magnets (which are installed in holes 44) as a Cryo-EM puck, but modified to have two flat sides to fit the rectangular opening of the loading station 4. It has the same grasping features 58 for puck handling tongs 30 and can be made to use the standard bar code and RFID tags to allow tracking and integration with laboratory information management systems. It has a locking rod hole 24 and a semicircular engagement groove 28 used to align puck 12 into storage canes, transport canes, and potentially automated handling devices.

It is not necessary to use puck 12 with the Thermo Fisher loading station 4. All operations other than capsule loading and unloading may be carried out in any container maintaining liquid nitrogen in the work area. The support platform 14 would be used in all cases. The same support platform 14 is used with and without the loading station.

Figure 6:
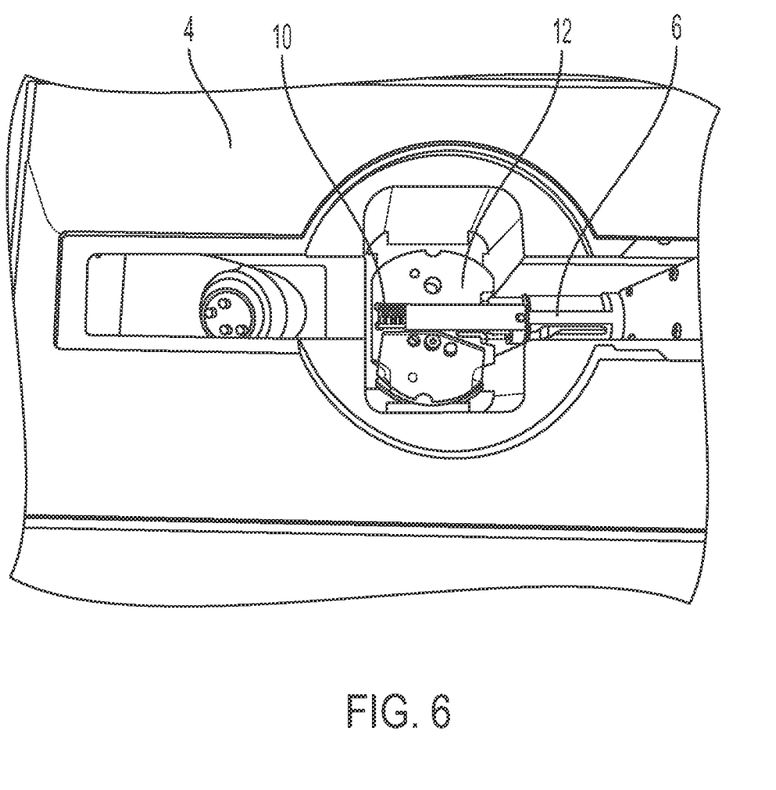
FIG. 6 is a perspective view of a cassette puck and Thermo Fisher cryo-EM sample cassette in a Thermo Fisher loading station, with a Thermo Fisher large handling tool partially engaged with the sample cassette in accordance with an embodiment.

FIG. 6 shows cassette puck 12 and Thermo Fisher cryo-EM sample cassette 10 in a Thermo Fisher loading station 4, with a Thermo Fisher large handling tool 6 partially engaged with the sample cassette 10. The cassette puck 12 is designed to work with the Thermo Fisher large handling tool 6. The cassette is restrained by receptacle 46 while the large handling tool 6 is inserted into or removed from the cassette. Cutout area 50 is dimensioned to clear the large face of tool 6 that goes towards the cassette and hold it in place during cassette transfer.

When a cassette puck 12 is placed on the support platform 14 and the cover 16 is unlocked (by rotating the locking screw 20 clockwise with the flat-bladed screwdriver, lowering the screw out of engagement with the rotating lid) and rotated about the shoulder screw 18 into the open position. The large Thermo Fisher handling tool 6, (or the small Thermo Fisher tongs (not shown)) or other convenient tool can be used to place a cassette 10 into puck 12, or remove a cassette from cassette puck 12. The handling tool 6 is detached from the cassette and puck as soon as the cassette is placed in cassette puck 12.

In another embodiment the cassette puck could be dimensioned to load a cassette or multiple cassettes vertically into a taller puck. In another embodiment, cassette puck 12 can isolate cassettes from casual mixing with the liquid nitrogen in a storage dewar, which could contain ice particles that could contaminate the cassette and the cryo-EM grids within it. In one embodiment, the cassette could be held in a compartment that is sealed after loading, and that has one or more passages containing filter media connecting the sealed compartment to the surrounding environment, so that when cassette puck 12 was removed from the liquid nitrogen, the vaporizing LN2 would not build pressure within the cassette compartment and puck. A second embodiment would be a cassette compartment that used a cover or door or lid that did not seal tightly, so that a small increase in pressure within the cassette compartment due to vaporizing LN2 was sufficient to break the seal and allow N2 gas to escape.

Figure 7:
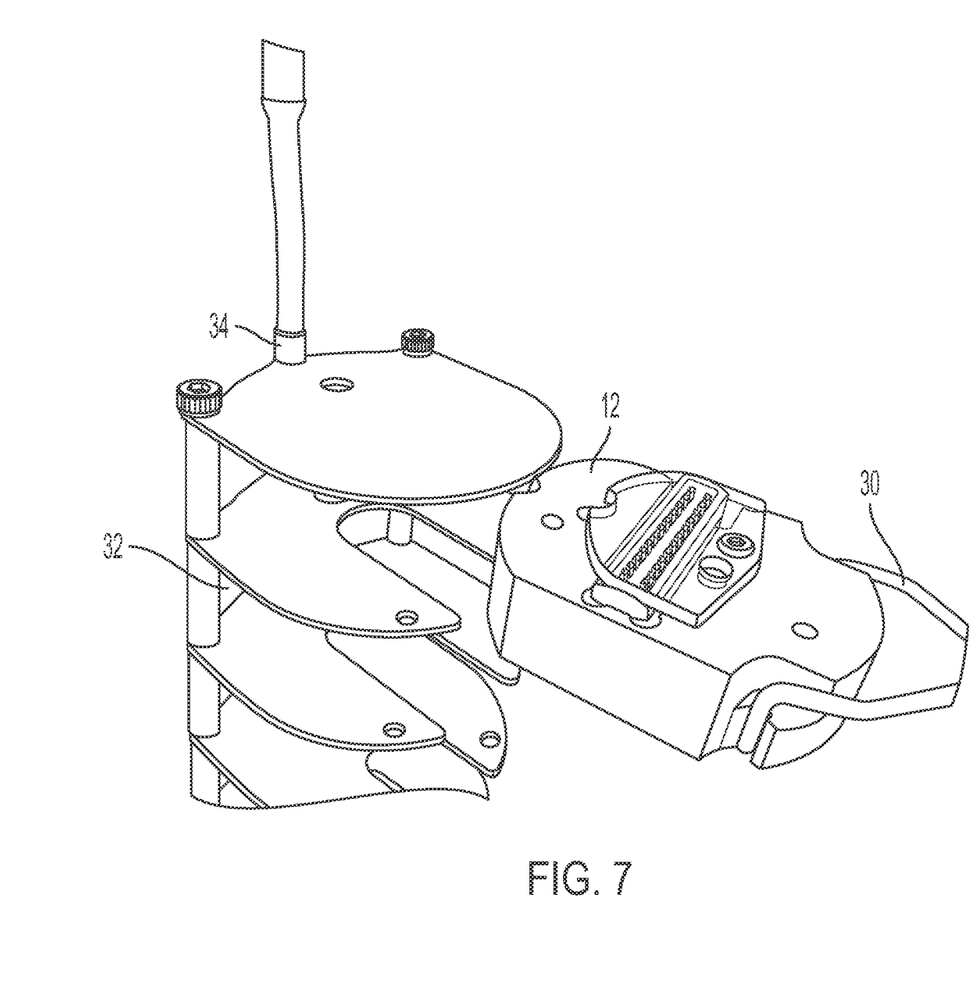
FIG. 7 is a perspective view of a puck grasping tongs being used to place loaded cassette puck into storage cane in accordance with an embodiment.

FIG. 7 shows puck handling tongs 30 being used to place a loaded cassette puck 12 into puck storage cane 32. The puck's semicircular engagement groove 28 in FIG. 5 corresponds to the central rod 34 in the storage cane. The storage cane goes into a storage Dewar (for example, a Worthington HC 34) filled with liquid nitrogen to provide long or short term cryogenic storage of the samples. The storage cane is constructed with magnetic stainless steel shelves, and cassette pucks 12 contain magnets to secure cassette pucks 12 to the shelves when the locking rod is removed.

Figure 8:
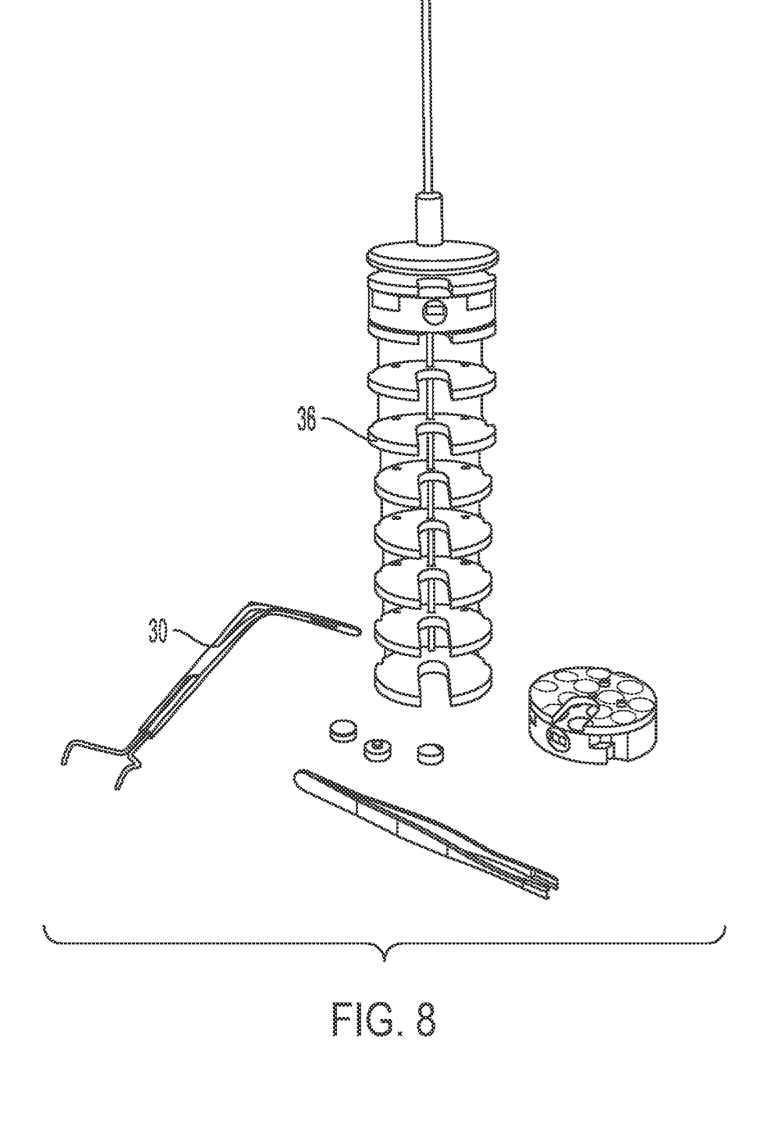
FIG. 8 is a perspective view of a puck transport cane accordance with an embodiment.

FIG. 8 shows puck transport cane 36 and puck handling tongs 30. Two through-holes 44 accept cylindrical magnets that help hold puck 12 into the storage cane and prevent them from rotating. The cassette puck 12 can be transferred to a shipping cane 34 for shipping from a home lab to cryo-EM microscope facility. The transport cane is placed in a dry shipping Dewar (for example, a Worthington CX100) which contains no liquid nitrogen or other liquid cryogen, but provides dry cryogenic conditions for cassette pucks 12. The shipping can is constructed with aluminum shelves, and each shelf contains two magnetic stainless steel screws that align with the two magnets in cassette puck 12 to secure cassette puck 12 to the shelves when the locking rod is removed.

What is claimed is:

1. A cassette puck for holding a cryoelectron microscopy sample that is compatible with sample handling and storage tools for X-ray cryocrystallography, the cassette puck comprising:
    a body comprising a first surface, a second surface, a first side, and a second side;
    a receptacle formed in the first surface and dimensioned to accept a sample cassette and a handling tool;
    first and second holes formed through the first and second surfaces in the body that allow the cassette puck to be gripped with tongs from above, wherein the first hole is positioned above the receptacle of the first surface, and the second hole is positioned below the receptacle on the first surface; and
    a set of grooves formed on the first and second sides of the body and dimensioned to allow the cassette puck to be gripped with a set of tongs.

2. The cassette puck of claim 1, further comprising at least one grid box receptacle having an integral protrusion and a pin dimensioned to insert into a notch in a grid box and keep the grid box in a fixed orientation corresponding to an indexed orientation.

3. The cassette puck of claim 1, further comprising a through-hole formed through the first and second surfaces into which a locking rod can be inserted.

4. The cassette puck of claim 1, further comprising a semicircular engagement groove formed through the first and second surfaces in an upper portion of the body used to align the cassette puck in storage and transport canes.

5. The cassette puck of claim 1, further comprising a magnet on the second surface.

6. The cassette puck of claim 1, further comprising a cover that rotates about a shaft on the first surface to cover the receptacle and hold the sample cassette in place.

7. The cassette puck of claim 6, further comprising a cover lock comprised of a set screw and a hole in the cover.

8. A sample holder system for cryoelectron microscopy samples that is compatible with sample handling and storage tools for X-ray cryocrystallography, the sample holder system comprising:
    a cassette puck comprising a first surface, a second surface, a first side, and a second side;
    a receptacle formed in the first surface and dimensioned to accept a sample cassette and a handling tool;
    first and second holes formed through the first and second surfaces that allow the cassette puck to be gripped with tongs from above, wherein the first hole is positioned above the receptacle of the first surface, and the second hole is positioned below the receptacle on the first surface;
    a set of grooves formed on the first and second sides of the cassette puck and dimensioned to allow the cassette puck to be gripped with a set of tongs; and
    a cassette puck support platform comprising a recess configured to hold the cassette puck in a fixed orientation during loading of the sample cassette.

9. The system of claim 8, the cassette puck further comprising at least one grid box receptacle having an integral protrusion and a pin dimensioned to insert into a notch in a grid box and keep the grid box in a fixed orientation corresponding to an indexed orientation.

10. The system of claim 8, the cassette puck further comprising a through-hole formed through the first and second surfaces.

11. The system of claim 8, the cassette puck further comprising a semicircular engagement groove formed through the first and second surfaces in an upper portion of the body used to align the cassette puck in storage and transport canes.

12. The system of claim 8, the cassette puck further comprising a magnet on the second surface.

13. The system of claim 8, the cassette puck further comprising a cover that rotates about a shaft on the first surface to cover the receptacle and hold the sample cassette in place.

14. The system of claim 13, the cassette puck further comprising a cover lock comprised of a set screw and a hole in the cover.

15. The system of claim 8, the cassette puck support platform further comprising a post that can be inserted into a through-hole of the cassette puck to thereby fix an orientation of the cassette puck in the support platform and prevent the cassette puck from sliding.

16. The system of claim 8, the cassette puck support platform being sized and shaped to fit within a commercial liquid nitrogen-filled loading station.

17. A process having steps for loading samples for use in single-particle cryoelectron microscopy, the steps comprising:

filling a cassette loading station with liquid nitrogen;

placing a cassette puck support platform into the cassette loading station so that the cassette puck support platform is fully immersed in the liquid nitrogen;

unlocking and rotating open a cover of a cassette puck;

placing the cassette puck onto the cassette puck support platform so that the cassette puck is held in place by features of the cassette puck support platform and cannot rotate or slide, and so that the cassette puck is fully immersed in liquid nitrogen;

loading grid boxes which contain grids holding samples into grid box receptacles of the cassette puck so that the grids are fully immersed in the liquid nitrogen;

grabbing a cryo-EM sample cassette using a handling tool;

inserting the cryo-EM sample cassette into the cassette puck so the cassette gripping end is immersed in the liquid nitrogen;

opening lids of the grid boxes to access the grids;

screwing the lids of the grid boxes into the cassette puck to secure the grid boxes within the cassette puck;

transferring selected ones of the grids from the grid box to the sample cassette; and closing the cover of the cassette puck by rotating the cover 180 degrees and engaging a cover lock with the cover to prevent subsequent rotation of the cover.

18. The process of claim 17, further comprising the steps of:

unscrewing the lids of the grid boxes from the cassette puck;

screwing the lids into the grid boxes;

closing the lids; and removing the grid boxes.

19. The process of claim 17, further comprising the steps of:

grabbing the cassette puck using puck handling tongs;

removing the cassette puck from the cassette puck support platform and the cassette loading station;

placing the cassette puck on an insulated surface or into a Dewar with liquid nitrogen;

changing the tong grip on the cassette puck to allow insertion into a storage or transport cane or using a second set of tongs to grip the cassette puck at its end as needed to allow insertion into a storage cane; and transferring the cassette puck to either a puck storage cane or a puck transport cane.

* * * * *